United States Patent [19]

Kanazawa

[11] Patent Number: 5,587,657
[45] Date of Patent: Dec. 24, 1996

[54] MAGNETIC RESONANCE IMAGING APPARATUS

[75] Inventor: Hitoshi Kanazawa, Tochigi-ken, Japan

[73] Assignee: Kabushiki Kaisha Toshiba, Tokyo, Japan

[21] Appl. No.: 187,603

[22] Filed: Jan. 26, 1994

[30]     Foreign Application Priority Data

Jan. 26, 1993   [JP]   Japan .................................. 5-010589

[51] Int. Cl.$^6$ .................................................. G01V 3/00
[52] U.S. Cl. ............................................ 324/309; 324/307
[58] Field of Search .................................. 324/309, 307, 324/306, 314, 318, 319, 320

[56]           References Cited

U.S. PATENT DOCUMENTS

| | | | |
|---|---|---|---|
| 4,633,178 | 12/1986 | Strobel et al. | 324/309 |
| 4,694,249 | 9/1987 | Post et al. | 324/309 |
| 4,697,148 | 9/1987 | Strobel et al. | 324/309 |
| 5,414,359 | 5/1995 | Mehlkopf et al. | 324/309 |
| 5,450,010 | 9/1995 | Van Der Meulen et al. | 324/309 |

*Primary Examiner*—Louis M. Arana
*Attorney, Agent, or Firm*—Limbach & Limbach L.L.P.

[57]           ABSTRACT

A magnetic resonance imaging apparatus comprises a static magnetic field forming magnet, gradient coils, a transmitter for transmitting an excitation pulse directed at a phantom, with the phantom having a non-magnetic material containing candidate nuclear species for magnetic resonance and having a periodic structure along the phase encoding direction. The magnetic resonance imaging apparatus further has a receiver for receiving echo signals from the non-magnetic material with the echo signals being outputted as echo data, a sequencer for controlling the gradient coils, the transmitter and the receiver thereby generating a plurality of echo signals of varying echo times at each excitation pulse while varying the strength of the phase-encoding gradient magnetic field pulses. The sequencer further controls the acquisition of the echo data required to reconstruct a MR image in split scans on the Fourier space. The resonance imaging apparatus further has a display unit for displaying the distribution of the echo data output from the receiver on the Fourier space. Finally, the imaging apparatus has an input unit for adjusting a reference strength of the phase-encoding gradient magnetic field pulse so that echo data corresponding to spatial frequencies in the phase-encoding direction, which are the inverse and an integral multiple of a predetermined period of the periodic structure of the non-magnetic material in the phantom, is maximized.

18 Claims, 10 Drawing Sheets

MAGNETIC RESONANCE IMAGING APPARATUS

BACKGROUND OF THE INVENTION

1. Field of the Invention

The present invention relates to a magnetic resonance imaging apparatus adapted to correct errors of phase encoding amounts in a split scan of a high-speed spin-echo imaging technique or the like.

2. Description of the Related Art

In a split scan of a high-speed spin-echo imaging technique performed by magnetic resonance imaging apparatus (MRI apparatus), an operation of exciting nuclear spins once by a 90-degree-flip radio-frequency (RF) excitation pulse to generate a plurality of echo signals (MR signals) and applying a predetermined phase encoding amount to each of the echo signals is repeated a plurality of times. Thereby, a plurality of echo signals of varying phase encoding amounts, which are required to reconstruct a-single MR image, are acquired.

The phase encoding amount for each echo signal will involve an error when at least one of the offset value of a gradient magnetic field pulse Ge, the duration of the pulse Ge and an increment in phase encoding amount between encoding steps deviates from their respective predetermined values. Errors of phase encoding amounts will produce image artifacts on a reconstructed image. Conventionally, the following methods have been used to decrease or correct such errors of phase encoding amounts.

According to a first method, gaps between every split region are eliminated and phase encoding amounts are set so that a plurality of echo signals are continuous on the k space (Fourier space). According to a second method, phase encoding amounts are gradually adjusted so that image artifacts on a reconstructed image will disappear. According to a third method, the output characteristics of units for generating gradient magnetic fields are measured and control signals to the units are adjusted on the basis of the results of the measurement.

With the first method, however, even if the continuity of echo signals is maintained in connection portions on the k space, errors of phase encoding amounts cannot be detected in portions other than the connection portions. In addition, even when normal phase encoding is not performed, the possibility exists that the continuity of echo signals may be maintained in the connection portions by accident.

With the second method, it is difficult to find an adjustment element that permits image artifacts to disappear.

The third method increases the possibility that predetermined phase encoding amounts cannot be obtained because of the insufficiency of gradient field generating power supplies and inhomogeneities in the magnetic field caused by eddy currents. In addition, with the third method, phase encoding amounts cannot be adjusted after installation.

SUMMARY OF THE INVENTION

It is therefore an object of the present invention to provide a magnetic resonance imaging apparatus which, in a split scan in which echo signals of varying echo times are acquired repeatedly while phase encoding amounts therefor are changed, determines variations in the reference value of phase encoding amounts quantitatively and permits the phase encoding amounts to be corrected on the basis of the variations thus determined.

According to the present invention there is provided a magnetic resonance imaging apparatus comprising: static magnetic field applying means for applying a static magnetic field to an imaging region; gradient magnetic field applying means for applying to the imaging region gradient magnetic field pulses along a phase encoding direction orthogonal to the direction of the static magnetic field; transmitter/receiver means for transmitting an excitation pulse to a phantom placed within the imaging region and having a non-magnetic material that contains candidate nuclear species for magnetic resonance and has a periodic structure along the phase encoding direction and for receiving echo signals from the non-magnetic material, the echo signals being output as echo data; sequence control means for controlling the gradient magnetic field applying means and the transmitter/receiver means in accordance with a predetermined sequence so as to generate a plurality of echo signals of varying echo times each time at each excitation pulse while varying the strength of the gradient magnetic field pulses so that varying phase encoding amounts are applied to the echo signals and to acquire echo data required to reconstruct an MR image in split scans on the Fourier space; display means for displaying the distribution of the echo data output from the transmitter/receiver means on the Fourier space; and input means for adjusting a reference strength of the gradient magnetic field pulse in the gradient magnetic field pulse applying means so that echo data corresponding to spatial frequencies in the phase encoding direction which are the inverse and an integral multiple of a predetermined period of the periodic structure of the non-magnetic material in the phantom becomes maximum.

The magnetic resonance imaging apparatus thus arranged permits the reference strength of and variations in the gradient magnetic field pulses to be adjusted quantitatively, facilitating the adjustment of phase encoding amounts in split scan and improving the accuracy of the adjustment. This also reduce the time required to adjust a pulse sequence for split scan. In addition, image artifacts due to variations in the phase encoding amounts are reduced, which provides magnetic resonance (MR) images having less image artifacts.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
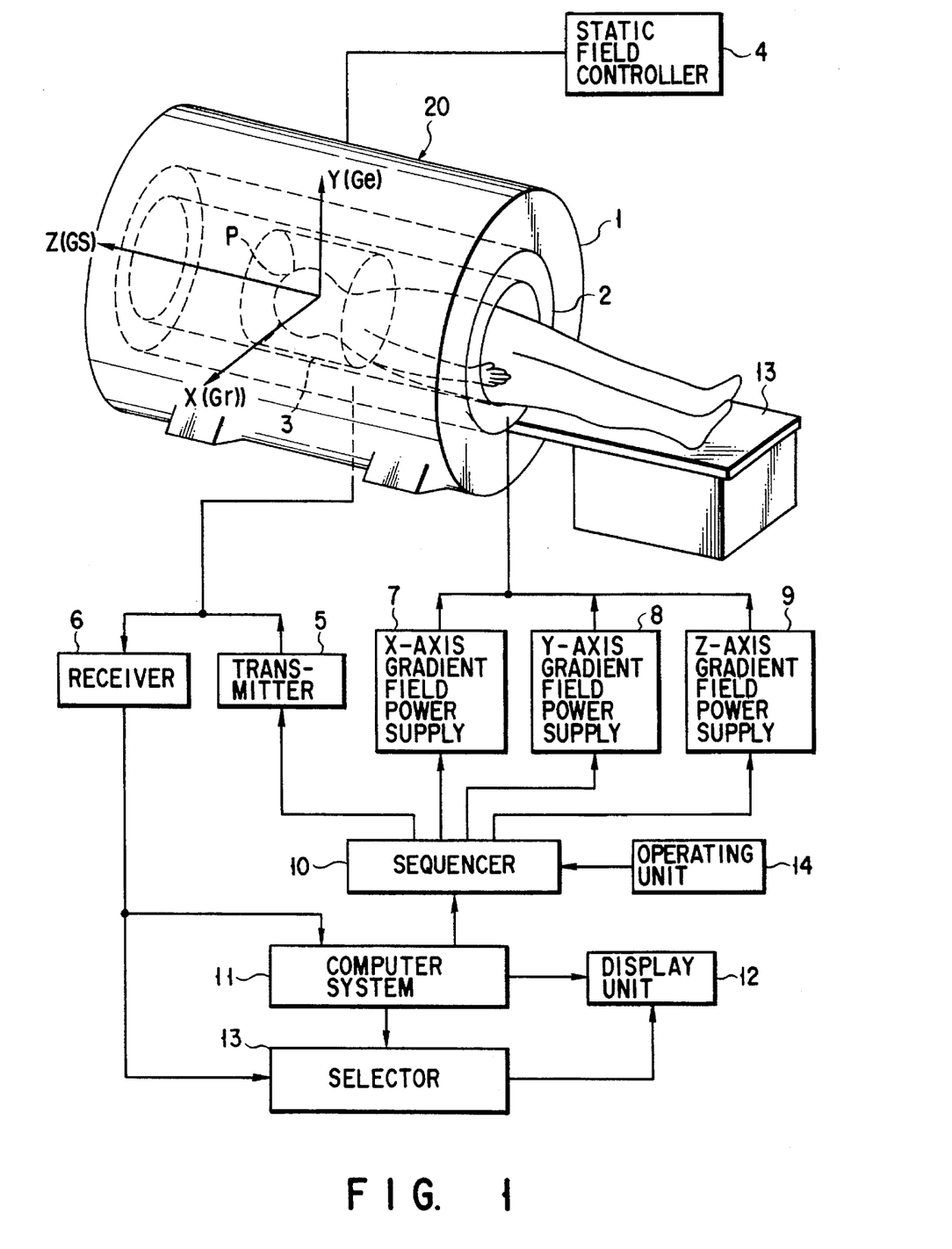
FIG. 1 is a schematic illustration of a magnetic resonance imaging apparatus according to a first embodiment of the present invention.

Referring now to FIG. 1, there is illustrated a magnetic resonance imaging apparatus according to a first embodiment of the present invention. Within a gantry 20 a static magnetic field forming magnet 1, X-axis, Y-axis and Z-axis gradient coils 2, and a transmitter/receiver coil 3 are placed. The static field forming magnet 1 is formed of a superconducting or non-superconducting coil. The gradient field coils 2 generate an X-axis gradient magnetic field Gx, a Y-axis gradient magnetic field Gy, and a Z-axis gradient magnetic field Gz which are orthogonal to one another in imaging space within the static magnetic field. The transmitter/receiver coil 3 generates an radio frequency excitation pulse for exciting nuclear spins and receives a magnetic resonance signal (MR signal) induced by magnetic resonance. At the time of magnetic resonance imaging, a subject to be imaged is accessed into the imaging space within the gantry 20.

The static field forming magnet 1 is driven by a static field controller 4. The transmitter/receiver coil 3 is selectively connected to a transmitter 5 and a receiver 6. The X-axis, Y-axis and Z-axis gradient field coils 2 are driven by an X-axis gradient field power supply 7, a Y-axis gradient field power supply 8, and a Z-axis gradient field power supply 9, respectively.

The gradient field power supplies 7, 8 and 9 and the transmitter 5 are driven by a sequencer to generate the X-axis, Y-axis and Z-axis gradient fields Gx, Gy and Gz and an RF pulse in accordance with a predetermined pulse sequence which will be described later. For convenience of description it is supposed here that the X-axis gradient field Gx, the Y-axis gradient field Gy and the z-axis gradient field Gz correspond to a readout gradient field Gx, a phase-encoding gradient field Gy and a slice-selection gradient field Gs, respectively. To the sequencer 10 is connected an operating unit 14 which is adapted to manually adjust an offset value (the reference strength of the phase encoding gradient field) and an incremental value (an incremental change in the phase-encoding amount).

Figure 2:
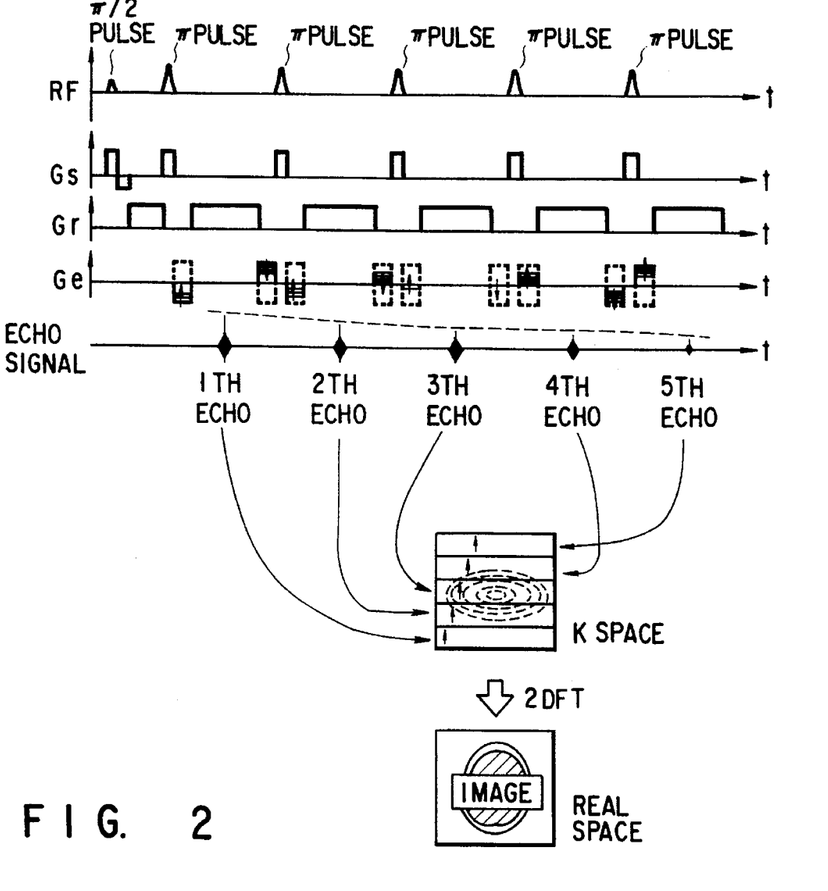
FIG. 2 is a diagram for use in explanation of a pulse sequence for a high-speed spin-echo technique as an example of a split scan technique and the distribution of echo data on the k space.

A computer system 11 has an imaging mode and an adjustment mode. A pulse sequence shown in FIG. 2 is common to the imaging mode and the adjustment mode. The imaging mode is selected when the subject P is actually imaged. At this time the computer system 11 drives the sequencer 10 and performs predetermined signal processing on echo data output from the receiver 6 to thereby reconstruct an MR image and display it on a display unit 12. The adjustment mode is selected to adjust the phase encoding amount by imaging a phantom placed in the imaging region. At this time a selector 13 is activated by the computer system 11. The selector selects only echo data having norm values greater than a predetermined threshold. The selected echo data is sent to the display unit 12 where its distribution on the k space (Fourier space) is displayed.

Figure 3:
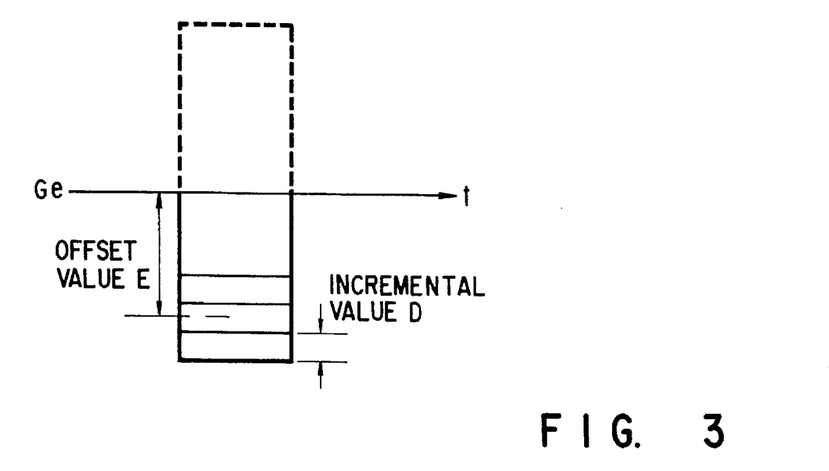
FIG. 3 illustrates an offset value and an incremental value.

FIG. 2 illustrates a high-speed spin-echo imaging pulse sequence as one of split scan techniques carried out by the sequencer and the procedure of distributing echo data onto the k space. In the high-speed spin-echo technique, 180-degree pulses are applied repeatedly subsequent to the application of a 90-degree pulse to thereby acquire a plurality of echo signals of varying echo times while changing the phase encoding amounts. As shown in FIG. 3, the offset value refers to the central value of each split region serving as the reference of all of phase encoding values, i.e., the field strength serving as the reference of the phase encoding gradient field, and the incremental value refers to an incremental change in the phase encoding amount between two adjoining encode steps in the same split region.

Figure 4:
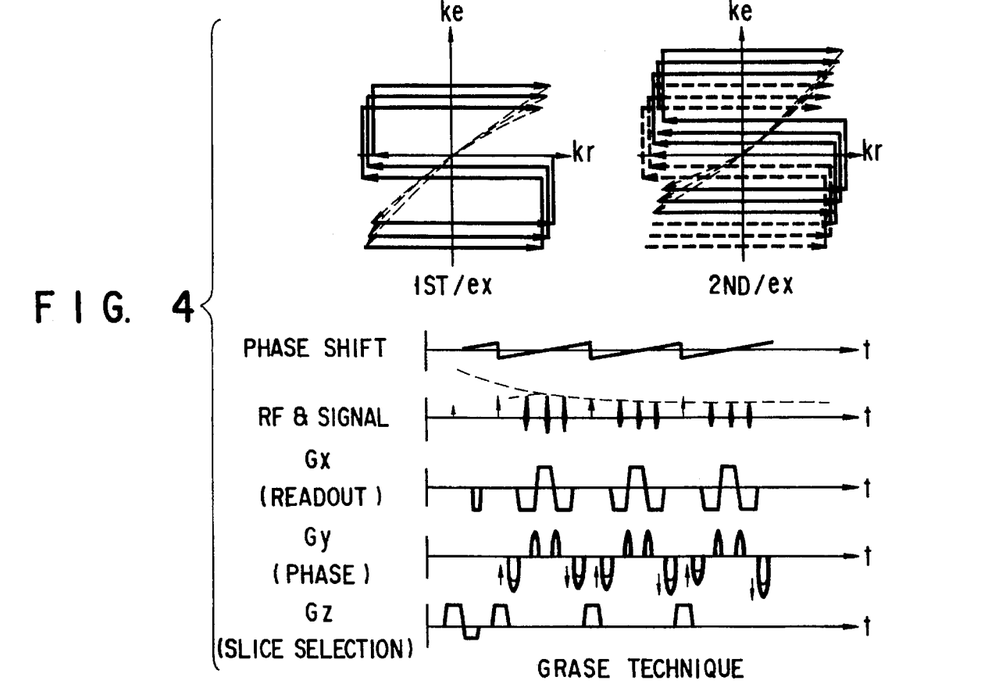
FIG. 4 is a diagram for use in explanation of a pulse sequence for a GRASE technique as another example of the split scan technique and the distribution of echo data on the k space.
Figure 5:
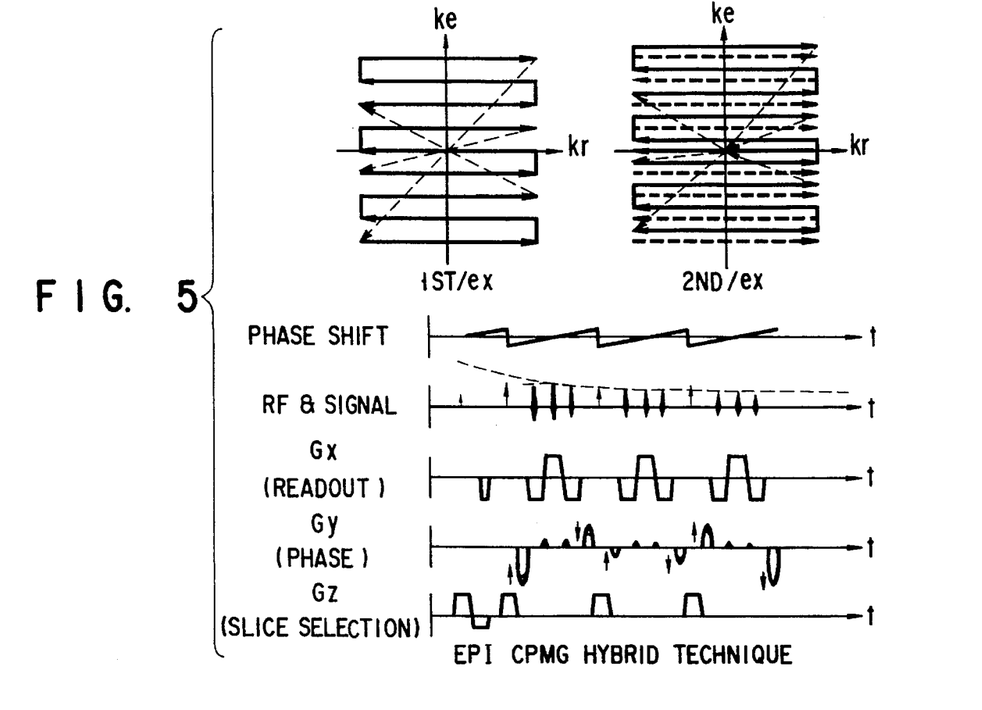
FIG. 5 is a diagram for use in explanation of a pulse sequence for an EPI-CPMG hybrid technique as still another example of the split scan technique and the distribution of echo data on the k space.
Figure 6:
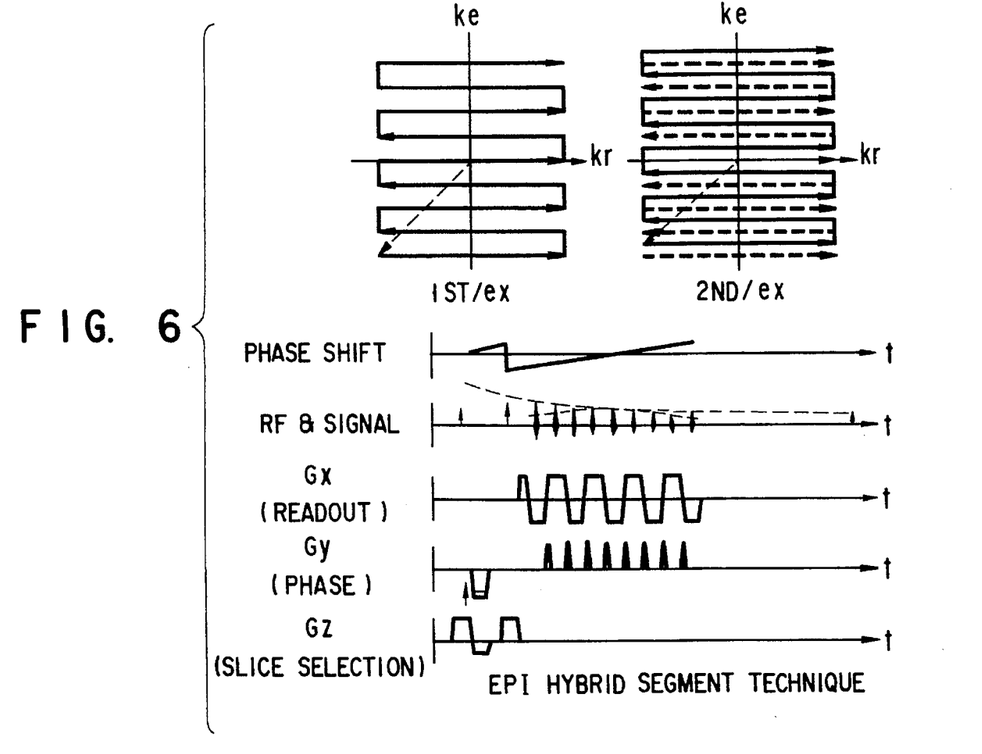
FIG. 6 is a diagram for use in explanation of a pulse sequence for an EPI hybrid segment technique as a further example of the split scan technique and the distribution of echo data on the k space.

Although the present invention is described herein as using the high-speed spin-echo technique, use may be made of another split scan technique such as the GRASE technique, the EPI-CPMG hybrid technique, or the EPI hybrid segment technique. FIG. 4 illustrates a GRASE pulse sequence and the procedure of distributing echo data on the k space. FIG. 5 illustrates an EPI-CPMG hybrid pulse sequence and the procedure of distributing echo data on the k space. FIG. 6 illustrates an EPI hybrid segment pulse sequence and the procedure of distributing echo data on the k space.

Figure 7A:
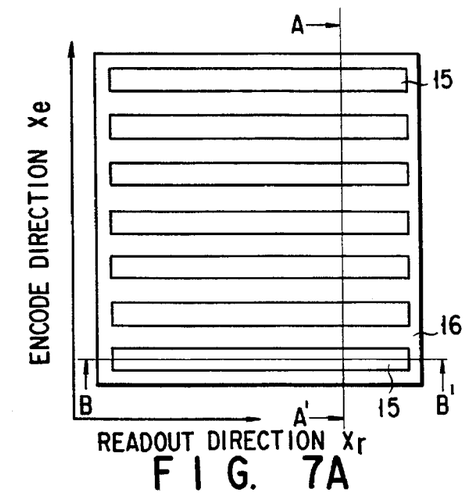
FIGS. 7A, 7B and 7C illustrate the structure of a phantom used in the first embodiment.
Figure 7B:
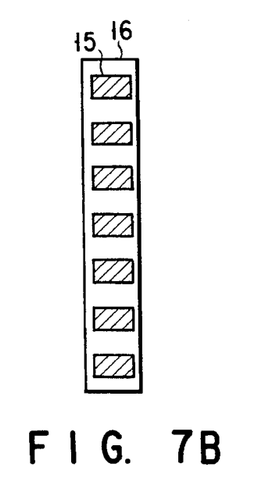
Figure 7C:
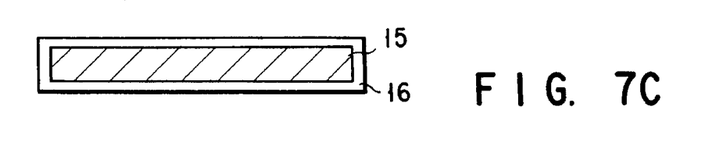

FIG. 7A is a front view of a phantom used in the present embodiment. FIG. 7B is a sectional view taken along line A–A' of FIG. 7A, and FIG. 7C is a sectional view taken along line B–B' of FIG. 7A. This phantom comprises a non-magnetic material 15 containing a lot of candidate nuclear species for MR imaging and a non-magnetic material 16 with no such candidate nuclear species for retaining and sealing the non-magnetic material 15.

When the candidate nuclear species for imaging are protons and the pulse sequence carried out for imaging is a T2 weighting sequence, water, for example, is used as the non-magnetic material 15. When the candidate nuclear species are protons and the pulse sequence is a T1 weighting sequence, on the other hand, water containing fat and copper-sulfate is used as the non-magnetic material 15. As the non-magnetic material 16 either acrylic glass or fiber reinforced plastics (FRP) can be used.

The non-magnetic material 15 is a region where an echo signal is high in strength. A plurality of such regions of the non-magnetic region 15, each having a fixed width and elongating along the readout direction, are formed spaced at regular intervals along the encode direction. Thus, an echo signal obtained by imaging such a phantom changes its strength in the phase encoding direction at regular intervals of a period corresponding to the interval at which the non-magnetic regions 15 are arranged.

Figure 8:
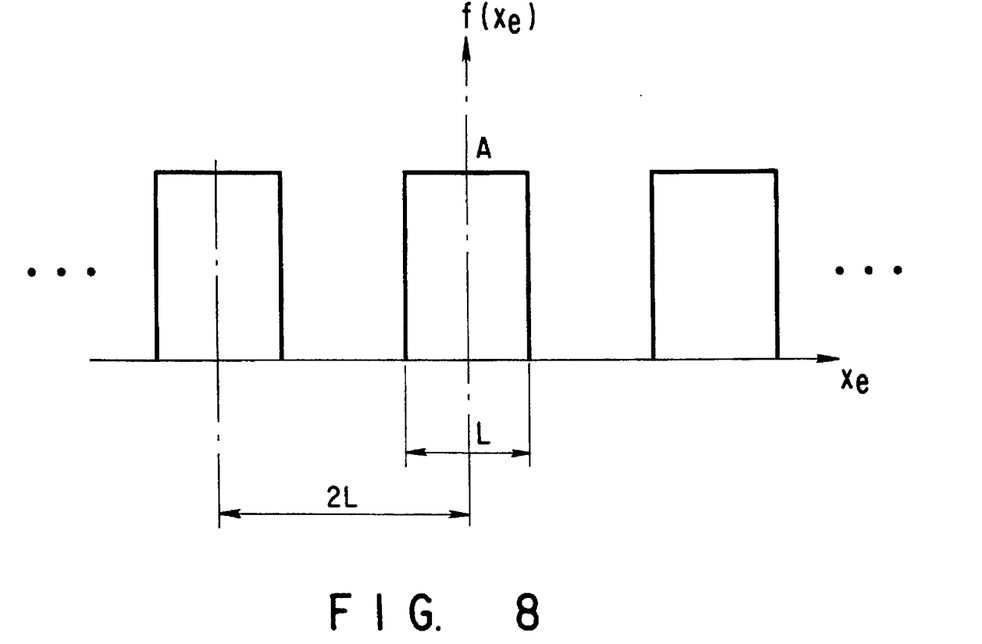
FIG. 8 shows the strength distribution of echo signals in the encoding direction obtained by imaging the phantom of FIGS. 7A to 7C.

The strength distribution of the echo signal in the encoding direction is rectangular in shape. Supposing that the period is 2L and the strength of the echo signal at its flat portion is A, the echo signal strength distribution $f(xe)$ in the encoding direction can be expanded as follows:

$$f(xe) = A + (2A/\pi)\cos(\pi xe/L) - (2A/3\pi)\cos(3\pi xe/L) + (2A/5\pi)\cos(5\pi xe/L) - \ldots \quad (1)$$

where xe is position in the encoding direction.

Supposing that the spatial frequencies in the read and the encode direction are kr and ke, respectively, and the FOV (field of view) in the encode direction is Xe, echo data $S(ke)$ along the ke axis on the k space (Fourier space) is represented by $$S(ke) = \int_{-(xe/2)}^{xe/2} f(xe)e^{-jkexe}dxe \quad (2)$$

Xe and data pitch $\Delta ke$ along the ke axis are related by $$Xe = 2\pi/\Delta ke \quad (3)$$

Therefore, using equations (1), (2) and (3) and taking sinc (x)=sin (x)/x, echo data $S(ke)$ along the ke axis on the k space obtained by using the phantom shown in FIGS. 7A to 7C is represented by $$\begin{aligned}S(ke) = &\ (2\pi A/\Delta ke)\mathrm{sinc}(\pi ke/\Delta ke) + \\ &\ (2A/\Delta ke)\mathrm{sinc}(\pi(ke + \pi/L)/\Delta ke) + \\ &\ (2A/\Delta ke)\mathrm{sinc}(\pi(ke - \pi/L)/\Delta ke) - \\ &\ (2A/3\Delta ke)\mathrm{sinc}(\pi(ke + 3\pi/L)/\Delta ke) - \\ &\ (2A/3\Delta ke)\mathrm{sinc}(\pi(ke - 3\pi/L)/\Delta ke) + \\ &\ (2A/5\Delta ke)\mathrm{sinc}(\pi(ke + 5\pi/L)/\Delta ke) + \\ &\ (2A/5\Delta ke)\mathrm{sinc}(\pi(ke - 5\pi/L)/\Delta ke) - \ldots\end{aligned} \quad (4)$$

Figure 9:
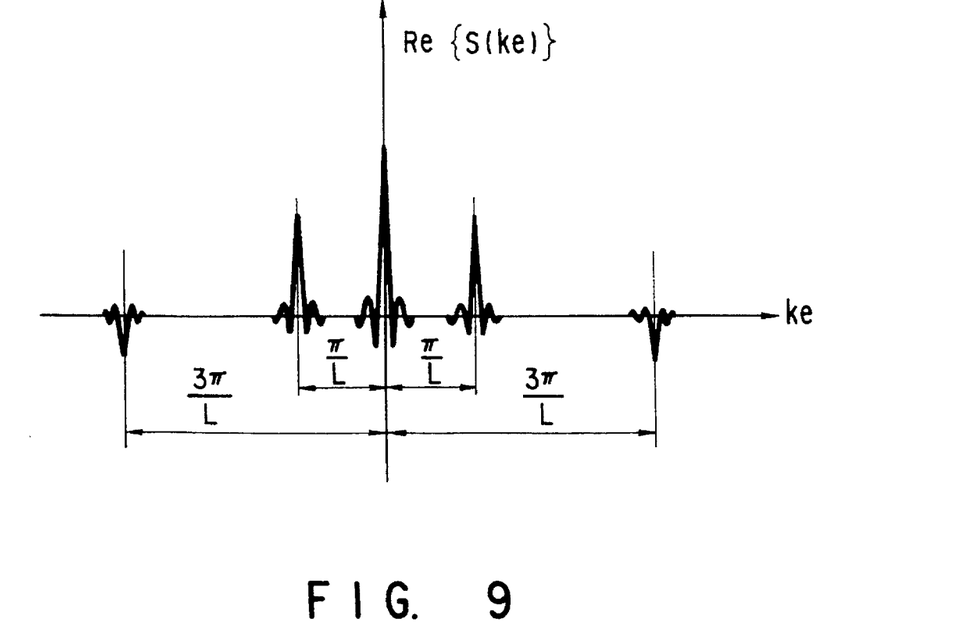
FIG. 9 show a waveform of echo signals obtained by imaging the phantom of FIGS. 7A to 7C.
Figures 10, 11, 13A:
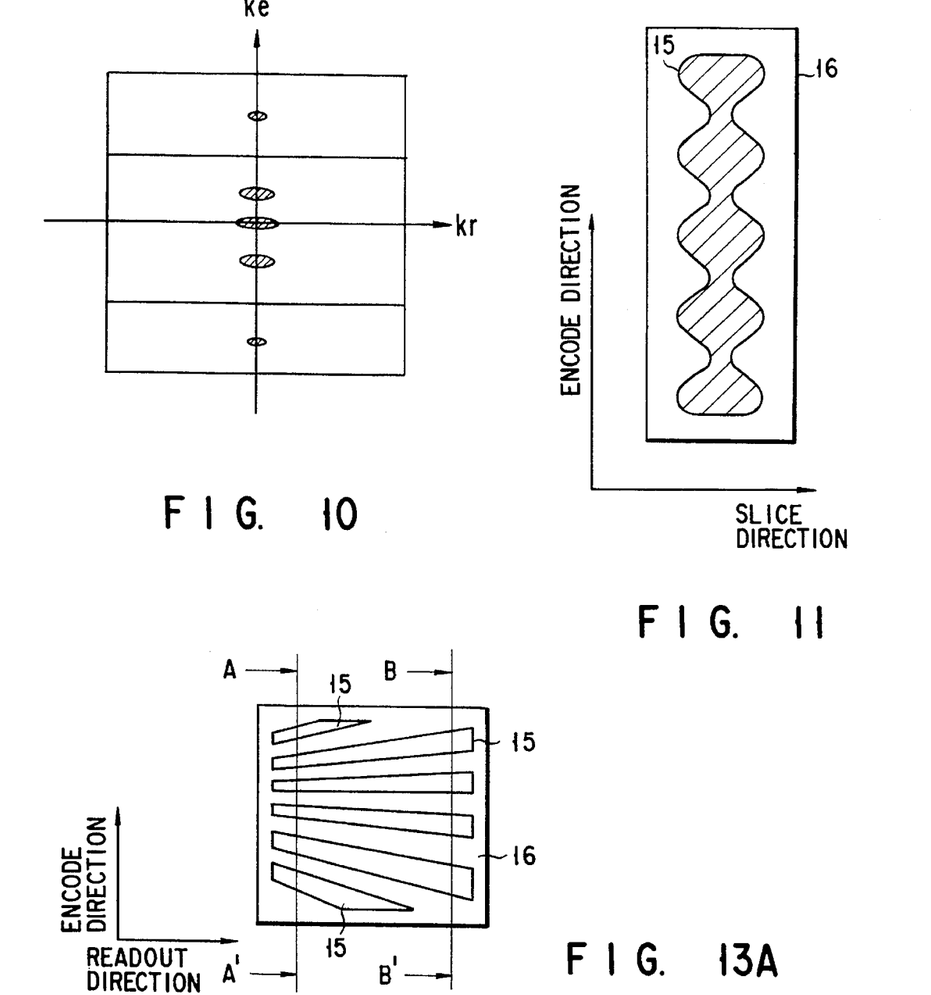
FIG. 10 illustrates the distribution of high-norm echo data on the k space.
FIG. 11 is a sectional view of the other phantom used in the first embodiment.
FIGS. 13A, 13B and 13C illustrates a phantom used in the second embodiment.

FIG. 9 illustrates the echo signal waveform corresponding to the echo data $S(ke)$. FIG. 10 illustrates the distribution on the k space of high-norm echo data selected by the selector 13 out of echo data obtained by imaging the above phantom using a four-echo fast spin-echo imaging sequence. This distribution corresponds to the case where the offset value and the incremental value involve no error. The distribution is displayed on the display unit 12 for observation by an operator.

As can be seen from FIG. 10, if the k space is split into regions by an even number of pieces of echo data (four in this example) and the fundamental period (pitch) in the encode direction of the non-magnetic regions 15 of the phantom is set so that echo data will be concentrated in the each central portion of the two split regions nearest to the kr axis, then high-signal regions due to harmonic components each will appear in the centers of the split regions as long as the pulsed gradient magnetic field in the phase encoding direction is adjusted perfectly so that the offset value and the incremental value involve no error.

The harmonic components have frequencies that are accurately odd multiples of the fundamental spatial angular frequency. If, therefore, one or both of the phase encoding offset value (the reference strength of the gradient magnetic field pulse) and the duration of the gradient magnetic field pulse are adjusted such that the echo data is concentrated in the central portion of each split region, i.e., the echo signal has a maximum strength in the central portion of each split region, then the phase encoding amount (offset value x duration) serving as the reference will have been adjusted accurately. Thus, while watching the distribution displayed on the display unit 12 the operator simply adjusts one or both of the offset value and the duration appropriately so that echo data is concentrated in the central portion of each split region. i.e., the echo signal has a maximum strength in the central portion of each split region, thereby correcting an error involved in the phase encoding amount serving as the reference for each phase encoding amount.

After the adjustment of the offset value and the duration the operator simply operates the operating unit 14 to adjust the incremental value so that artifacts on an MR image reconstructed by the computer system 11 and displayed on the display unit 12 will be eliminated.

As described above, the present embodiment facilitates the adjustment of the phase encoding amount in the split scan and improves the accuracy of the adjustment. This will reduce the time required to adjust the pulse sequence in the split scan. In addition, image artifacts due to variations in the phase encoding amount can be reduced.

FIG. 11 is a sectional view of a phantom that can be used in place of the phantom shown in FIG. 7. In this phantom, the non-magnetic material 15 is shaped into a sine-wave-like form so that harmonic components (due to high-pitch shape) are reduced as compared with the phantom of FIG. 7. Thus, the use of this phantom permits harmonic components higher than second order to be removed. Echo data relating to such harmonic components will therefore not appear on the distribution, making adjustments of the offset value and the incremental value easy.

A second embodiment will be described hereinafter. The second embodiment is intended to provide automatic adjustments of the offset and incremental value.

Figure 12:
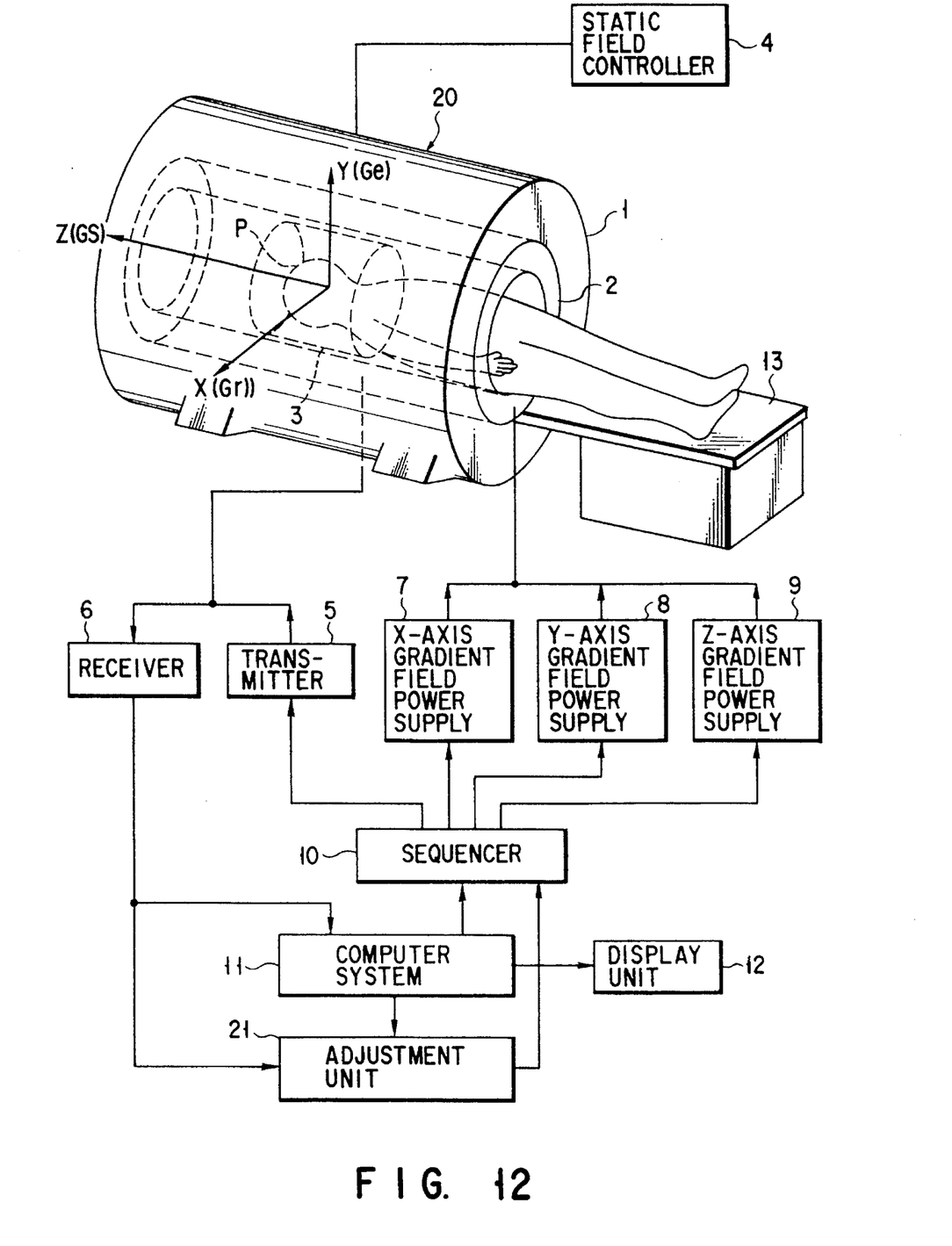
FIG. 12 is a schematic illustration of a magnetic resonance imaging apparatus according to a second embodiment of the present invention.

FIG. 12 is a schematic illustration of a nuclear magnetic resonance imaging apparatus according to the second embodiment of the present invention. In the figure, corresponding parts to those in FIG. 1 are denoted by like reference numerals and thus description thereof is omitted.

Echo data output from the receive 6 is applied to an adjustment unit 21, which makes optimum adjustments of the offset value and the incremental value of the sequencer 10 using the echo data.

Figure 13B:
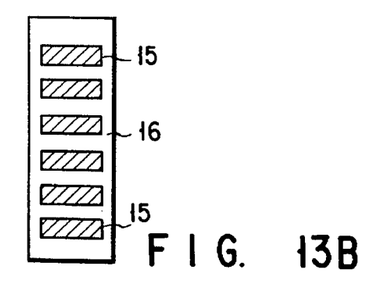
Figure 13C:
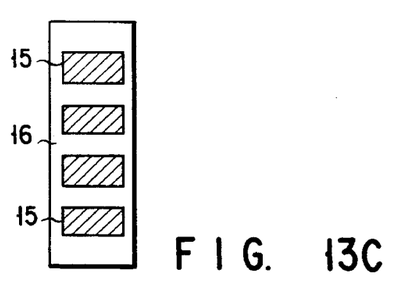

FIGS. 13A, 13B and 13C illustrate the structure of a phantom used in the second embodiment. More specifically, FIG. 13A is a plan view of the phantom, FIG. 13B is a sectional view taken along line A–A' of FIG. 13A, and FIG. 13C is a sectional view taken along line B–B' of FIG. 13A. In this phantom, the pitch of the non-magnetic regions 15 in sections parallel to the encode direction is a linear function of position in the readout direction. In this example, the pitch gradually increases in the left-to-right direction in FIG. 13A.

Figure 14:
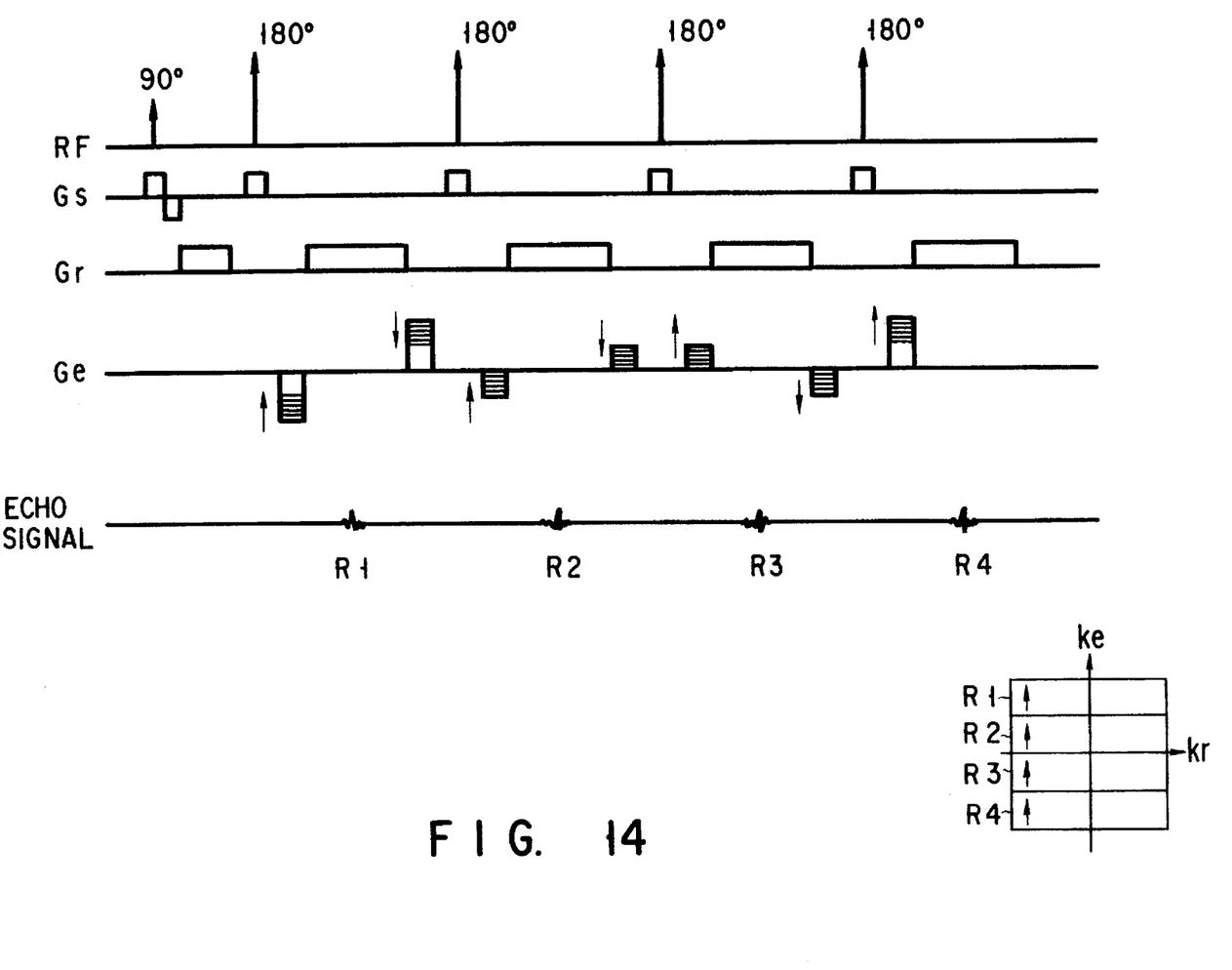
FIG. 14 illustrates a four-echo high-speed spin-echo imaging pulse sequence used in the second embodiment.

Hereinafter, a method of adjusting the phase encoding amount by the adjustment unit 21 will be described. FIG. 14 illustrates a four-echo fast spin-echo pulse sequence that is used in common in the imaging mode and the adjustment mode. This pulse sequence is the same as that pulse sequence shown in FIG. 2.

Figures 15, 16, 17, 18:
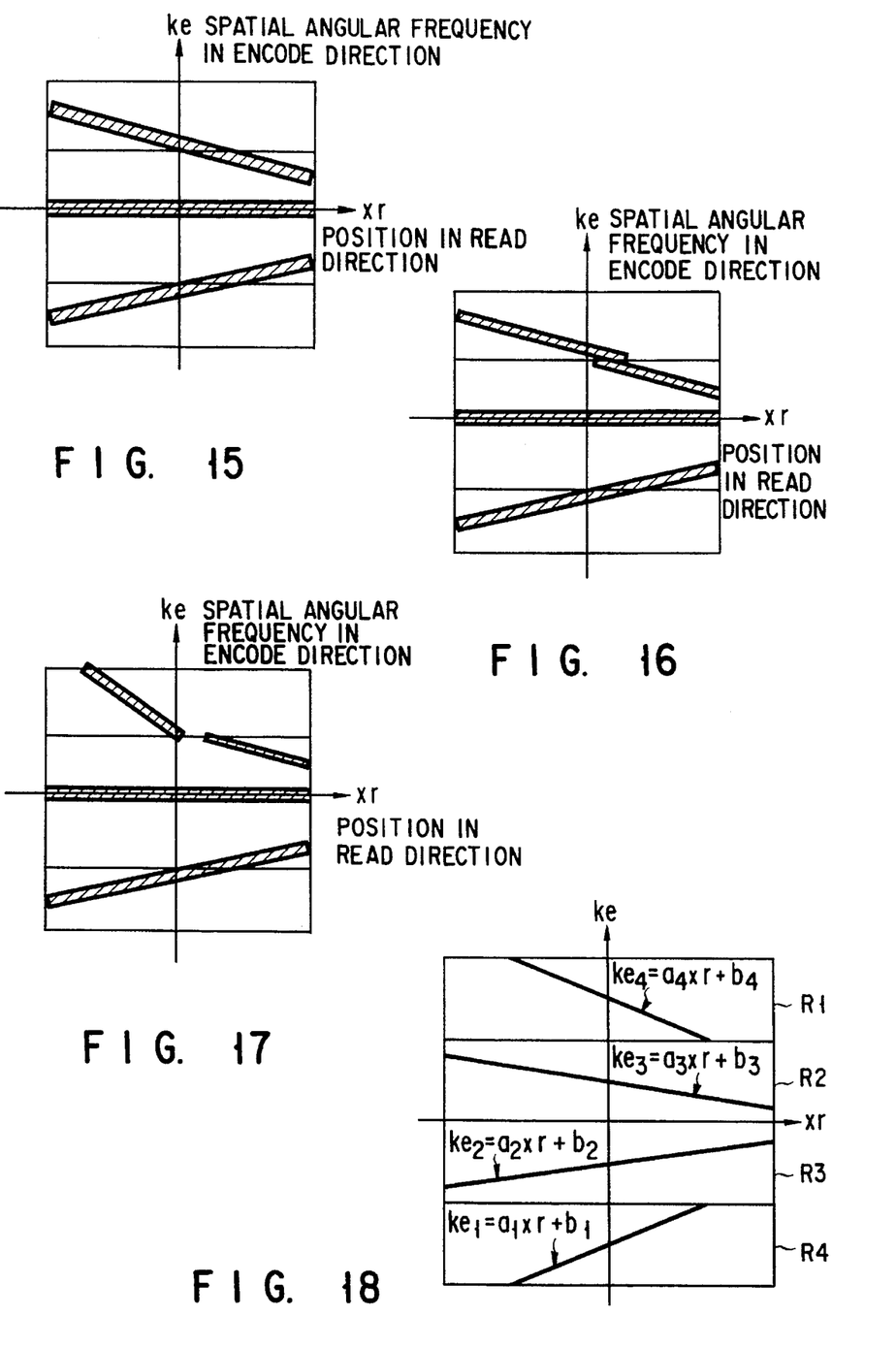
FIG. 15 shows the distribution on the xr-ke space of echo data from the phantom of FIGS. 13A, 13B and 13C subjected to one-dimensional Fourier transformation with respect to the readout direction alone in the ideal case where an offset value and an incremental value both have no error.
FIG. 16 shows the distribution on the xr-ke space of echo data from the phantom of FIGS. 13A, 13B and 13C subjected to one-dimensional Fourier transformation with respect to the readout direction alone in the case where the offset value contains an error.
FIG. 17 shows the distribution on the xr-ke space of echo data from the phantom of FIGS. 13A, 13B and 13C subjected to one-dimensional Fourier transformation with respect to the readout direction alone in the case where the incremental value contains an error.
FIG. 18 shows the distribution on the xr-ke space of echo data obtained by a pulse sequence the signal acquisition range of which is extended by increasing the phase encoding amounts more than in FIG. 14.

The adjustment unit 21 performs one-dimensional Fourier transformation on the echo data output from the receiver 6 with respect to the readout direction only. FIG. 15 illustrates the distribution on the xr-ke space of echo data obtained by imaging the phantom of FIGS. 13A, 13B and 13C and subjected to one-dimensional Fourier transformation with respect to the readout direction only in the ideal case where the offset value and the incremental value involve no error. FIG. 16 illustrates the distribution on the xr-ke space of echo data obtained by imaging the phantom of FIGS. 13A, 13B and 13C and subjected to one-dimensional Fourier transformation with respect to the readout direction only in the case where the offset value involves an error. FIG. 17 illustrates the distribution on the xr-ke space of echo data obtained by imaging the phantom of FIGS. 13A, 13B and 13C and subjected to one-dimensional Fourier transformation with respect to the readout direction only in the case where the incremental value involves an error. The linear high-signal regions due to harmonic components higher than second order, which actually appears on the xr-ke space, are omitted in FIGS. 15 to 17.

As shown in FIG. 15, when the offset value and the incremental value involve no error, a linear high-signal region appears just on the xr axis and a linear high-signal region appears in each split region. The two linear regions in the two adjoining split regions of the same polarity meet each other smoothly with the same gradient at the boundary between the split regions.

As shown in FIG. 16, however, when the offset value involves an error, two linear regions will not meet each other at the boundary between the two split regions of the same polarity through these linear regions have the same gradient.

As shown in FIG. 17, on the other hand, when the incremental value is abnormal, each of the linear regions in the two split regions of the same polarity has a separate gradient.

The use of such a phantom as shown in FIGS. 13A to 13C permits a determination to be made from data distribution on the xr-ke space as to whether the offset value involves an error or whether the incremental value involves an error. When the linear regions do not meet each other, it is determined that the offset value involves an error. When each of the linear regions has a separate gradient, on the other hand, it is determined that the incremental value involves an error. Of course, these determinations are made by the adjustment unit 21. The present embodiment is adapted to make not only error determinations but also automatic adjustments of the offset value and the incremental value.

Hereinafter, the automatic adjustment procedure regions in the split regions appear symmetrically with respect to the xr axis. The two linear regions in the two adjoining split regions of the same polarity meet each other smoothly with the same gradient at the boundary between the split regions.

As shown in FIG. 16, however, when the offset value involves an error, two linear regions will not meet each other at the boundary between the two split regions of the same polarity through these linear regions have the same gradient.

As shown in FIG. 17, on the other hand, when the incremental value is abnormal, each of the linear regions in the two split regions of the same polarity has a separate gradient.

The use of such a phantom as shown in FIGS. 13A to 13C permits a determination to be made from data distribution on the xr-ke space as to whether the offset value involves an error or whether the incremental value involves an error. When the linear regions do not meet each other, it is determined that the offset value involves an error. When each of the linear regions has a separate gradient, on the other hand, it is determined that the incremental value involves an error. Of course, these determinations are made by the adjustment unit 21. The present embodiment is adapted to make not only error determinations but also automatic adjustments of the offset value and the incremental value. split regions R1 and R2 (or R3 and R4) of the same polarity.

Figure 19:
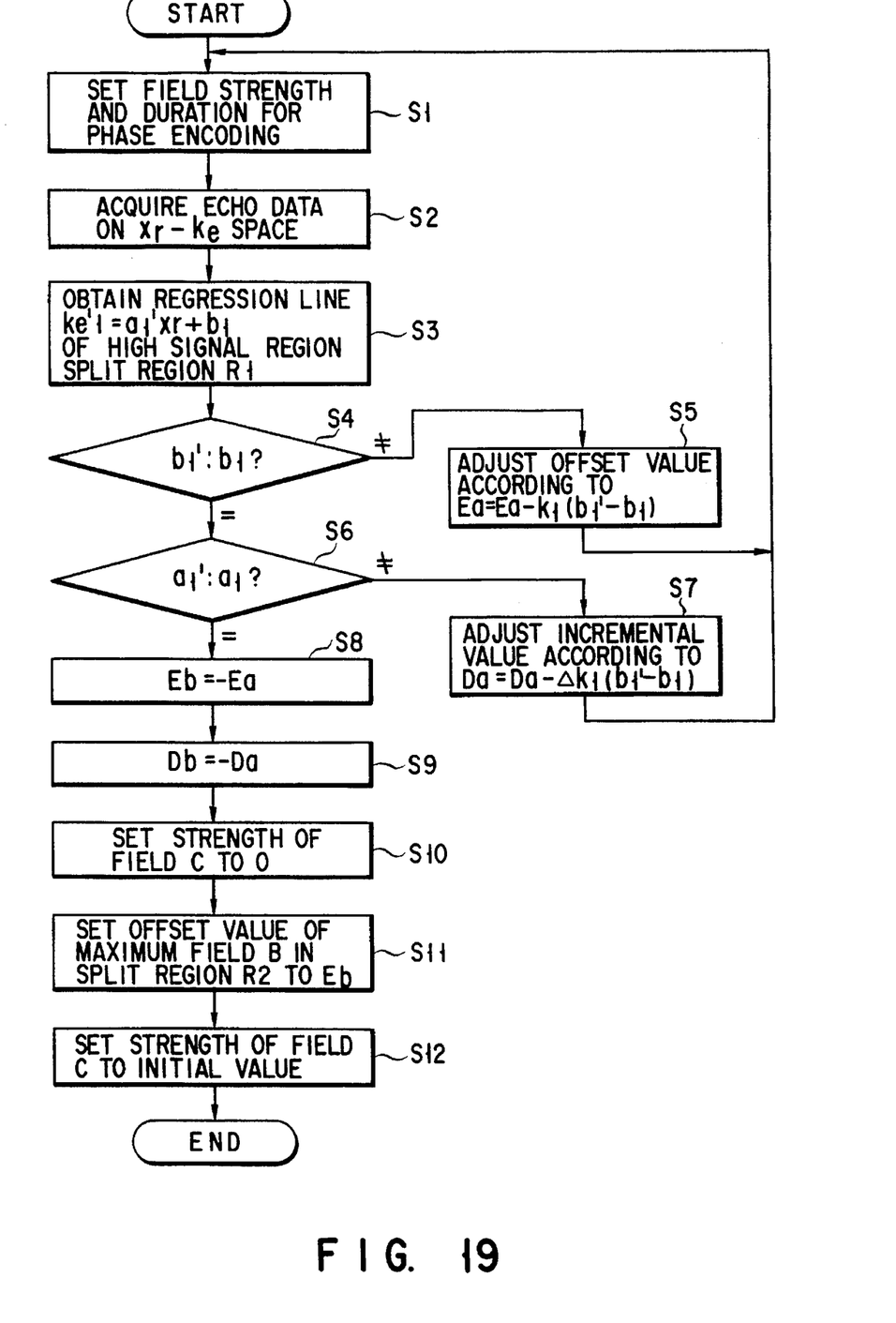
FIG. 19 is a flowchart for the phase encoding amount adjustment procedure for obtaining such ideal echo data as shown in FIG. 18.

FIG. 19 is a flowchart for the procedure of adjusting the offset and incremental values which is performed by the adjustment unit 21 to acquire such ideal echo data as shown in FIG. 18. In step S1, a reference phase encoding amount (gradient field strength x duration) is set.

In step S2, a four-echo fast spin-echo pulse sequence based on the phase encoding amount set in step S1 is carried out, whereby echo data is acquired and then subjected to one-dimensional Fourier transformation with respect to the readout direction. Thus, the distribution of echo data on the xr-ke space is obtained.

In step S3, a regression line ke1'=a1'×Xr+b1' for the high-signal region in the split region R1 in the echo data distribution obtained in step S2 is obtained.

In step S4, a comparison is made between the value of b1' of the regression line ke1' obtained in step S3 and the value of b1 of the ideal regression line ke1.

When b1'≠b1 in step S4, the offset value, Ea, in the encode step corresponding to the split region R1 in the signal acquisition pulse sequence is changed to Ea=Ea−k1(b1'−B1) in step S5. Note that k1 is a constant larger than 0.

When b1'=b1 in step S4, on the other hand, a comparison is made, in step S6, between the value of a1' of the regression line ke1' obtained in step S3 and the value of a1 of the ideal regression line ke1 in the split region R1.

When a1'≠a1 in step S6, the incremental value, Da, in the encode step corresponding to the split region R1 in the signal acquisition pulse sequence is changed to Da=Da−Δk1(a1'−a1) in step S7. Note that Δk1 is a constant greater than 0.

When a1'=a1 in step S6, on the other hand, the offset value Eb and the incremental value Db of the phase encoding step for rephasing corresponding to the split region R1 in the signal acquisition pulse sequence, which are of the same magnitude as at the time of signal acquisition but of the opposite polarity, are set to Eb=−Ea and Db=−Da in steps S8 and S9, respectively.

In step S10, the minimum value of the encode step corresponding to the split region R2 in the signal acquisition pulse sequence is set to 0. In step S11, the offset value of the encode step corresponding to the split region R2 in the signal acquisition pulse sequence is set to that offset value Eb of the phase encode step for rephasing corresponding to the split region R1. In subsequent step S12, the strength of the gradient magnetic field in the phase encode step corresponding to the split region R2 in the signal acquisition pulse sequence is reset to that initial gradient field strength set in step S1.

By the above procedure, errors of the offset and incremental values for the phase encoding amount for the split region R1 are corrected. For the other split regions R2, R3 and R4 as well, the same procedure as the above procedure is performed to adjust the phase encoding amounts. It should be noted, however, that for the split region R4, steps S8 through S12 are not carried out.

According to the present embodiment, as described above, errors of phase encoding amounts in the split scan are corrected automatically.

The three types of phantoms used in the first and second embodiments described above are prepared such that a high-signal region forming non-magnetic material containing a lot of candidate nuclear species for imaging is formed in a desired shape. Alternatively, a desired shape of high-signal regions may be realized by preparing a phantom containing a lot of candidate nuclear species uniformly and irradiating an imaging region with one or more selective saturation excitation pulses immediately prior to the split scan.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance imaging apparatus comprising:

static magnetic field applying means for applying a static magnetic field to an imaging region;

gradient magnetic field applying means for applying to said imaging region gradient magnetic field pulses along a phase encoding direction orthogonal to the direction of said static magnetic field;

transmitter/receiver means for transmitting an excitation pulse to a phantom placed within said imaging region and having a non-magnetic material that contains candidate nuclear species for magnetic resonance and has a periodic structure along the phase encoding direction and for receiving echo signals from said non-magnetic material, said echo signals being output as echo data;

sequence control means for controlling said gradient magnetic field applying means and said transmitter/receiver means in accordance with a predetermined sequence so as to generate a plurality of echo signals of varying echo times each time at each excitation pulse while varying the strength of said gradient magnetic field pulses so that varying phase encoding amounts are applied to said echo signals and to acquire echo data required to reconstruct an MR image in split scans on the Fourier space;

display means for displaying the distribution of said echo data output from said transmitter/receiver means on the Fourier space; and input means for adjusting a reference strength of said gradient magnetic field pulse in said gradient magnetic field pulse applying means so that echo data corresponding to spatial frequencies in said phase encoding direction which are the inverse and an integral multiple of a predetermined period of the periodic structure of said non-magnetic material in said phantom becomes maximum.

2. The apparatus according to claim 1, further comprising means for selecting echo data having norm values greater than a predetermined threshold out of said echo data output from said transmitter/receiver means and supplying it to said display means.

3. The apparatus according to claim 1, in which said phantom includes a plurality of rectangular regions containing said non-magnetic material which are spaced at regular intervals along said phase encoding direction.

4. The apparatus according to claim 1, in which said non-magnetic material in said phantom is shaped into a sine-wave-like form along said phase encoding direction.

5. The apparatus according to claim 1, in which said sequence control means controls said gradient magnetic field applying means and said transmitter/receiver means in accordance with a T2 weighting sequence, and in which said non-magnetic material in said phantom is water.

6. The apparatus according to claim 1, in which said sequence control means controls said gradient magnetic field applying means and said transmitter/receiver means in accordance with a T1 weighting sequence, and in which said non-magnetic material in said phantom is water containing fat and copper-sulfate.

7. The apparatus according to claim 1, in which said non-magnetic material in said phantom is held by a non-magnetic material with no candidate nuclear species for magnetic resonance.

8. The apparatus according to claim 7, in which said non-magnetic material with no candidate nuclear species is formed of either acrylic glass or plastic.

9. A magnetic resonance imaging apparatus comprising:

static magnetic field applying means for applying a static magnetic field to an imaging region;

gradient magnetic field applying means for applying to said imaging region gradient magnetic field pulses along a phase encoding direction orthogonal to the direction of said static magnetic field;

transmitter/receiver means for transmitting an excitation pulse to a phantom placed within said imaging region and having a non-magnetic material that contains candidate nuclear species for magnetic resonance and has a periodic structure along the phase encoding direction, the inverse of a predetermined period of said periodic structure varying in proportion to position in the readout direction, and for receiving echo signals from said non-magnetic material, said echo signals being output as echo data;

sequence control means for controlling said gradient magnetic field applying means and said transmitter/receiver means in accordance with a predetermined sequence so as to generate a plurality of echo signals of varying echo times each time at each excitation pulse while varying the strength of said gradient magnetic field pulses so that varying phase encoding amounts are applied to said echo signals and to acquire echo signals required to reconstruct an MR image in split scans on the Fourier space; and adjusting means for controlling said gradient magnetic field applying means to adjust a reference strength of said gradient magnetic field pulses and variations in said phase encoding amounts in said gradient magnetic field applying means on the basis of comparisons between an ideal linear function $ke=a \times xr+b$, where a and b are coefficients and a linear function $ke'=a' \times xr+b'$, where a' and b' are coefficients for expressing the linear distribution of echo data with high norm values, in data space formed of a spatial frequency axis ke along the phase encoding direction and a real space axis xr along the readout direction, the echo data is obtained by one-dimensional Fourier transforming the echo signals output from said transmitter/receiver means with respect to the read direction orthogonal to the phase encoding direction.

10. The apparatus according to claim 9, in which said adjusting means adjusts the reference strength of said gradient magnetic field pulses on the basis of a comparison between b' and b and variations in the phase encoding amounts on the basis of a comparison between a' and a.

11. The apparatus according to claim 9, in which said adjusting means changes the reference strength of said gradient magnetic field pulses by k×(b'−b) where k is a constant greater than 0.

12. The apparatus according to claim 9, in which said adjusting means changes variations in the phase encoding amounts by k×(a'−a) where k is a constant greater than 0.

13. The apparatus according to claim 9, in which said regions of said non-magnetic material containing candidate nuclear species in said phantom are arranged along the phase encoding direction, and the distance between adjoining non-magnetic material regions gradually increases along the readout direction.

14. The apparatus according to claim 9, in which said regions of said non-magnetic material containing candidate nuclear species in said phantom are arranged along the phase encoding direction, and the distance between adjoining non-magnetic material regions is set in a linear function of position in the readout direction.

15. The apparatus according to claim 9, in which said sequence control means controls said gradient magnetic field applying means and said transmitter/receiver means in accordance with a T2 weighting sequence, and in which said non-magnetic material in said phantom is water.

16. The apparatus according to claim 9, in which said sequence control means controls said gradient magnetic field applying means and said transmitter/receiver means in accordance with a T1 weighting sequence, and in which said non-magnetic material in said phantom is water containing fat and copper-sulfate.

17. The apparatus according to claim 9, in which said non-magnetic material in said phantom is held by a non-magnetic material with no candidate nuclear species for magnetic resonance.

18. The apparatus according to claim 9, in which said non-magnetic material with no candidate nuclear species is formed of either acrylic glass or plastic.

\* \* \* \* \*